（12）United States Patent
Lee

(10) Patent No.: US 12,142,331 B2
(45) Date of Patent: Nov. 12, 2024

(54) MEMORY CONTROLLER AND OPERATING METHOD THEREOF

(71) Applicant: SK hynix Inc., Icheon-si (KR)

(72) Inventor: Seung Yeol Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 10 days.

(21) Appl. No.: 18/060,437

(22) Filed: Nov. 30, 2022

(65) Prior Publication Data
US 2023/0386594 A1    Nov. 30, 2023

(30) Foreign Application Priority Data

May 26, 2022   (KR) .......................... 10-2022-0065011

(51) Int. Cl.
*G11C 29/10*     (2006.01)
*G11C 29/12*     (2006.01)

(52) U.S. Cl.
CPC ........ *G11C 29/10* (2013.01); *G11C 29/12005* (2013.01); *G11C 29/12015* (2013.01)

(58) Field of Classification Search
CPC .............. G11C 29/10; G11C 29/12005; G11C 29/12015
See application file for complete search history.

(56) References Cited

U.S. PATENT DOCUMENTS

| 7,453,737 B2 * | 11/2008 | Ha ....................... G11C 29/028 365/185.17 |
| 7,647,467 B1 | 1/2010 | Hutsell et al. |
| 8,001,434 B1 * | 8/2011 | Lee ........................ G11C 29/10 714/719 |
| 10,885,259 B2 | 1/2021 | Baidya et al. |
| 10,971,243 B2 * | 4/2021 | Busi ....................... G11C 29/70 |
| 2017/0200094 A1 * | 7/2017 | Bruestle ................... G06F 7/483 |
| 2017/0323224 A1 * | 11/2017 | Bruestle ................... G06F 7/582 |
| 2020/0321070 A1 * | 10/2020 | Hanagandi ........... G06F 11/1048 |
| 2023/0401274 A1 * | 12/2023 | Denninghoff ...... G06Q 30/0251 |

FOREIGN PATENT DOCUMENTS

KR    10-2015-0114795 A    10/2015

* cited by examiner

*Primary Examiner* — Samir W Rizk

(57) ABSTRACT

A memory controller includes a test controller, a test information storage, and a machine learning processor. The test controller performs a test on a memory device using a target pattern selected from among a plurality of test patterns in each of a plurality of test modes in which voltage and time conditions of test signals are set differently. The test information storage stores test result information including values associated with fail bits of the memory device measured in the test. The machine learning processor detects a defect acceleration mode in which a defect of the memory device is accelerated, among the plurality of test modes, in the test performed using the target pattern on the basis of the test result information.

19 Claims, 11 Drawing Sheets

FIG. 4

TR_INF

| Test Pattern | Test Mode | Fail Address | Fail Bit | Fail Time |
|---|---|---|---|---|
| TP1 | DM | ADDR1 | 1 | 2 |
| | TM1 | ADDR1 | 2 | 2 |
| | TM2 | ADDR1 | 3 | 2 |
| | TM3 | ADDR1 | 2 | 2 |
| TP2 | DM | ADDR2 | 2 | 2 |
| | TM1 | ADDR2 | 2 | 2 |
| | TM2 | ADDR2 | 2 | 2 |
| | TM3 | ADDR2 | 2 | 1 |

MEMORY CONTROLLER AND OPERATING METHOD THEREOF

CROSS-REFERENCE TO RELATED APPLICATION

The present application claims priority under 35 U.S.C. § 119(a) to Korean patent application number 10-2022-0065011, filed on May 26, 2022, in the Korean Intellectual Property Office, the entire disclosure of which is incorporated herein by reference.

BACKGROUND

1. Technical Field

Various embodiments generally relate to an electronic device, and more particularly, to a memory controller in an electronic device and a method of operating the memory controller.

2. Related Art

A storage device is configured to store data in response to control by a host device such as a computer or a smartphone. A storage device may include a memory device that stores data and a memory controller that controls the memory device. Memory devices may be divided into volatile memory devices and non-volatile memory devices.

A volatile memory device may retain data as long as power is being supplied, and may lose stored data in the absence of power supply. Types of volatile memory devices may include Static Random Access Memory (SRAM), Dynamic Random Access Memory (DRAM), and the like.

A non-volatile memory device does not lose data in the absence of power supply. Types of non-volatile memory devices may include Read Only Memory (ROM), Programmable ROM (PROM), Electrically Programmable ROM (EPROM), Electrically Erasable and Programmable ROM (EEPROM), flash memory, and the like.

A memory controller may test for defects in a memory device. For example, the memory controller may perform a test on the memory device using various time settings and signal voltage conditions in memory device testing. The memory controller may determine a degree of defect in the memory device using a fail bit count detected as a result of the test.

SUMMARY

Various embodiments of the present disclosure are directed to a memory controller having optimal defect detection performance and an operating method thereof.

According to an embodiment, a memory controller may include a test controller that performs a test on a memory device using a target pattern selected from among a plurality of test patterns for each of a plurality of test modes, in which test signals have voltage and time conditions that are set differently, a test information storage that stores test result information including values associated with fail bits of the memory device measured in the test, and a machine learning processor that detects a defect acceleration mode, from among the plurality of test modes, in which a defect of the memory device is accelerated using the test result information obtained in the test performed using the target pattern.

According to an embodiment, a method of operating a memory controller may include performing a test on a memory device using a target pattern selected from among a plurality of test patterns in each of a plurality of test modes in which voltage and time conditions of test signals are set differently, calculating a defect value on the basis of values associated with fail bits of the memory device measured in the test, and detecting a defect acceleration mode, from among the plurality of test modes, in which a defect of the memory device is accelerated in the test performed using the target pattern based on test result information including the defect value.

BRIEF DESCRIPTION OF THE DRAWINGS

FIG. 4 is a diagram illustrating test result information according to an embodiment of the present disclosure;

DETAILED DESCRIPTION

Specific structural or functional descriptions of examples of embodiments in accordance with concepts disclosed in this specification are illustrated only to describe the examples of embodiments in accordance with the concepts. The examples of embodiments in accordance with the concepts may be carried out in various forms, but the descriptions are not limited to the examples of embodiments described in this specification.

Figure 1:
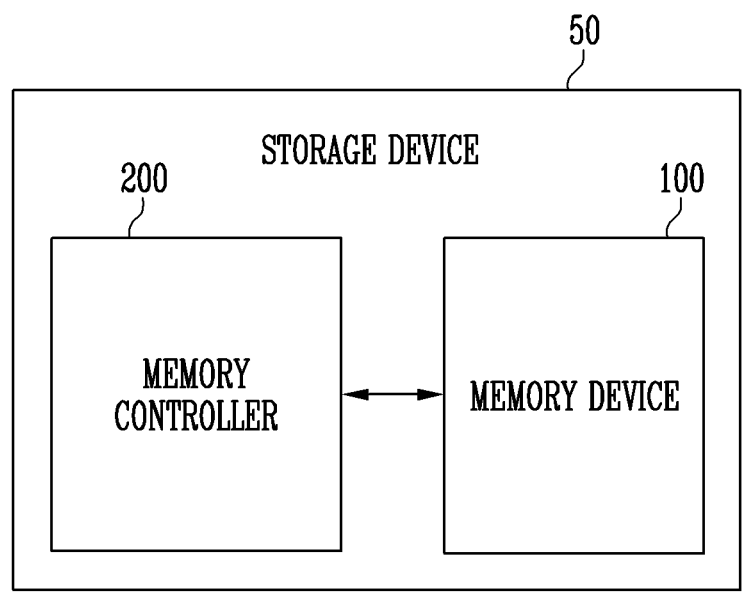
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 configured to control the memory device 100. The storage device 50 may be configured to store data in response to control of a host. Examples of a host may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface corresponding to a communication method with the host. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), and a wafer-level stack package (WSP).

The memory device 100 may store data. The memory device 100 may operate in response to control by the memory controller 200. The memory device 100 may include a memory cell array that includes a plurality of memory cells storing data.

Each of the memory cells may be configured as a single level cell (SLC) that stores one bit of data, a multi-level cell (MLC) that stores two bits of data, a triple-level cell (TLC) that stores three bits of data, or a quadruple level cell (QLC) that stores four bits of data.

According to an embodiment, the memory device 100 may include a random access memory (RAM) and a non-volatile memory (NVM).

According to embodiments, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 100 may receive a command and an address from the memory controller 200 and access an area selected in response to the address in the memory cell array. That is, the memory device 100 may perform an operation instructed by the command on the area selected by the address. For example, the memory device 100 may perform a write (program) operation, a read operation, and an erase operation. During a program operation, the memory device 100 may program data into the area selected in response to the address. During a read operation, the memory device 100 may read data from the area selected by the address. During an erase operation, the memory device 100 may erase data from the area selected by the address.

The memory controller 200 may control general operations of the storage device 50.

According to an embodiment, the memory controller 200 may receive data and a logical block address (LBA) from the host and convert the logical block address (LBA) into a physical block address (PBA), which indicates an address of memory cells in which data included in the memory device 100 is stored.

The memory controller 200 may control the memory device 100 to perform a program operation, a read operation, or an erase operation in response to a request from the host.

During a program operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

According to an embodiment, the memory controller 200 may control at least two memory devices 100. The memory controller 200 may control the memory devices 100 according to an interleaving scheme so as to improve operational performance. The interleaving scheme may be an operating scheme that allows overlapping of operating periods between the two or more memory devices 100.

According to an embodiment, the memory controller 200 may test for a defect in the memory device 100. For example, the memory controller 200 may test the memory device 100 using various test patterns that are used with changing test modes, which have different time and voltage conditions for test signals applied to the memory device 100. The memory controller 200 may determine the degree of detected defects of the memory device 100 using test results, such as the number of fail bits detected in rows and columns of the memory device 100 and the time needed to detect the fail bits.

The memory controller 200 may select one test pattern from among a plurality of test patterns as a target pattern. Test patterns may include program patterns, which are generated by an algorithm for detecting defects in memory device 100.

The memory controller 200 may detect a defect acceleration mode, from among the plurality of test modes, that corresponds to the target pattern. The defect acceleration mode may refer to a mode in which defect detection of the memory device 100 is accelerated, when compared to detection in a default mode, in a test performed using the target pattern.

The memory controller 200 may detect a defect of the memory device 100 more quickly and with higher reliability by testing the memory device 100 in a defect acceleration mode optimized for the target pattern. Since the defect acceleration mode may be exist whenever the target pattern is changed, the number of the defect acceleration mode may be a plural. In a word, there are a plurality of defect acceleration modes corresponding to the plurality of test patterns, respectively.

The memory controller 200 may calculate a defect value of the memory device 100 using the number of fail bits of the memory device 100 and the time taken to detect the fail bits, which are detected as a result of the test. The defect value may be proportional to the detected fail bit count and may be inversely proportional to the time required to detect the fail bits.

The memory controller 200 may calculate a default defect value. The default defect value may correspond to a defect value of the memory device 100 that is measured in a test using the target pattern in a default mode, in which voltage and time conditions of test signals are set to default values.

The memory controller 200 may detect a defect acceleration mode, from among the plurality of test modes, that corresponds to the target pattern by comparing defect values of the memory device 100 measured in the different test modes using the target pattern and comparing those defect values with the default defect value. The defect acceleration mode may refer to a test mode in which the defect value of the memory device 100 measured in a test using the target pattern is the highest from among defect values of other test modes.

The host may communicate with the storage device 50 using at least one of various communication methods such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
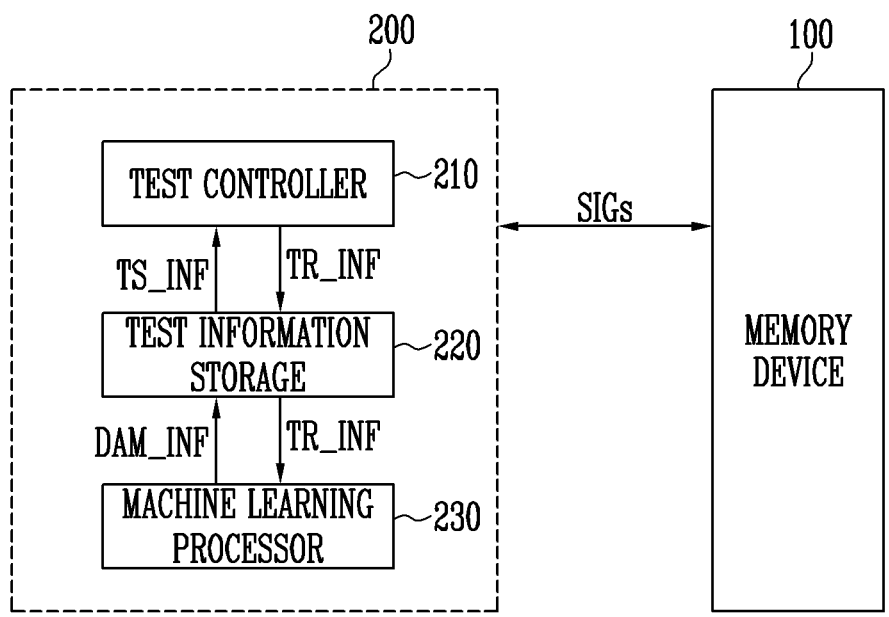
FIG. 2 is a diagram illustrating a memory controller shown in FIG. 1.

FIG. 2 is a diagram illustrating a configuration and an operation of memory controller shown in FIG. 1.

Referring to FIG. 2, a memory device 100 may include at least one of a random access memory (RAM) and a nonvolatile memory (NVM).

A memory controller 200 may exchange test signals SIGs with the memory device 100 in order to test the memory device 100. The test signals SIGs may include VCORE, VPERI, VPP, VBB, VBBW, VBLP, VCP, VDDI/VSSI, VDDL/VSSDDL, VDDA/VSSA, VREF, and the like. However, types of the test signals SIGs are not limited to the above examples.

According to an embodiment, the memory controller 200 may include a test controller 210, a test information storage 220, and a machine learning processor 230.

The test controller 210 may select a test mode from a plurality of test modes and a test pattern from a plurality of test patterns based on test setup information TS_INF, which is received from the test information storage 220. For example, the test controller 210 may run a test on the memory device 100 using a target pattern, which is selected from among the plurality of test patterns, in a default mode. In the default mode, the voltage and time conditions of the test signals SIGs are set to default values. In addition, the test controller 210 may perform tests on the memory device 100 using the target pattern in each of the plurality of test modes, in which voltage and time conditions of the test signals SIGs vary and are set differently in different test modes.

According to an embodiment, the test controller 210 may test the memory device 100 using each of the plurality of test patterns, and each of the test patterns can be used in tests with each of the plurality of test modes. This may be full-scale investigation and as a result, for each test pattern, a defect acceleration mode with high reliability may be detected.

According to an embodiment, after a defect acceleration mode is identified for a first test pattern, the test controller 210 may run additional tests on the memory device 100 using a different second target pattern. The second target pattern may be tested against each of the plurality of test modes except for the defect acceleration mode corresponding to the first target pattern. As a result, the time required to identify the defect acceleration mode associated with the second test pattern may be shortened.

The test controller 210 may generate test result information TR_INF, which includes the number of fail bits of the memory device 100 measured in a test and the time taken to detect the fail bits.

The test information storage 220 may store the test setup information TS_INF, the test result information TR_INF, and defect acceleration mode information DAM_INF.

The test setup information TS_INF may include information about the plurality of test modes applied during the test and information about the plurality of test patterns.

In the plurality of test modes, the voltage conditions and time conditions of the test signals SIGs may be set differently. The voltage conditions may include voltage levels, slopes, offsets, and waveforms of the test signals SIGs. The time conditions may include the timing and time periods in which the test signals SIGs are applied.

The plurality of test patterns may include program patterns that are generated by an algorithm for detecting a defect of the memory device 100. For example, the plurality of patterns may include test patterns according to March, Jump(X/Y), Dist, SI, Jump (Half), Jump(Random), and Block schemes, or other schemes known in the art.

The test result information TR_INF may include values associated with the fail bits of the memory device 100 measured in a test. The values associated with the fail bits may include a fail bit count, the amount of time taken to detect the fail bit, and a time at which the fail bits are detected. However, these examples of the values associated with the fail bits are not limited in embodiments of the disclosure.

The defect acceleration mode information DAM_INF may include a defect acceleration mode in which a defect of the memory device 100 is accelerated the most with respect to the selected target pattern, and a defect value corresponding to the defect acceleration mode. The defect value may be based on the number of fail bits detected in the test and the time taken to detect the fail bits. The defect value may be proportional to the fail bit count and may be inversely proportional to the time taken to detect the fail bits. The method of calculating the defect value is not limited to this embodiment. The defect value may be calculated using the fail bit count and the time taken to detect the fail bits on the basis of various other polynomial expressions.

The machine learning processor 230 may calculate a default defect value based on the number of fail bits detected in the test performed using the target pattern in the default mode and the time taken to detect the fail bits. The machine learning processor 230 may calculate a defect value corresponding to each of the test modes on the basis of the fail bit count and the fail bit detection time included in the test result information TR_INF.

The machine learning processor 230 may detect a defect acceleration mode corresponding to the target pattern using a comparison result between the default defect value and the defect values corresponding to the plurality of test modes, respectively.

Figure 3:
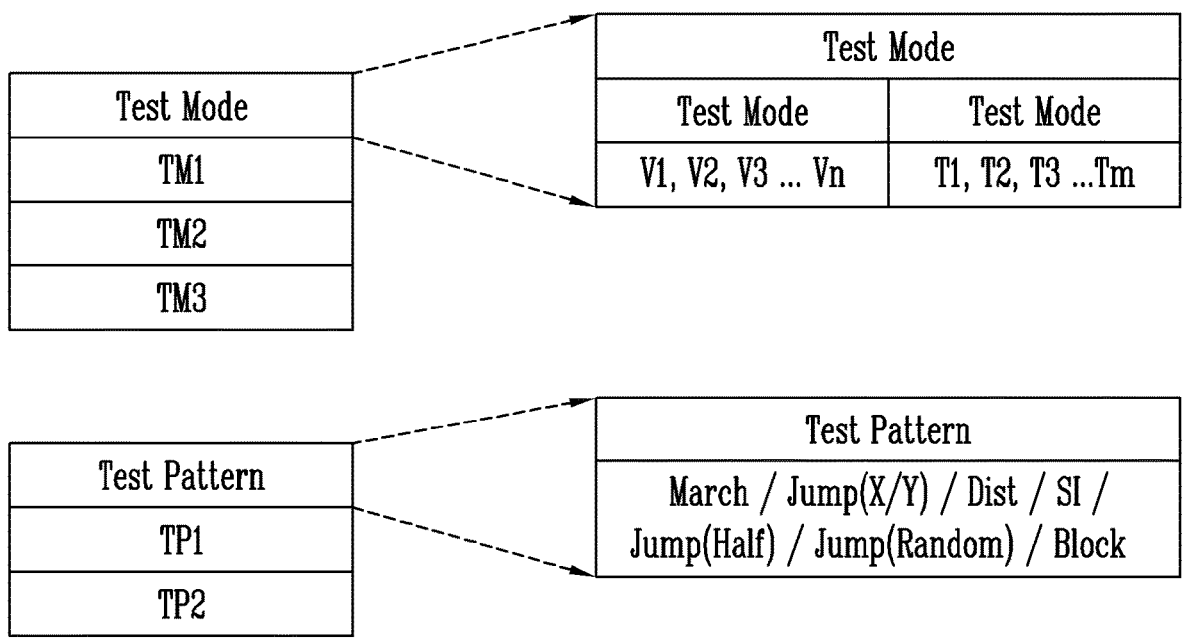
FIG. 3 is a diagram illustrating test setup information according to an embodiment of the present disclosure.

FIG. 3 is a diagram illustrating test setup information according to an embodiment of the present disclosure.

Referring to FIG. 3, a test setup information TS_INF may include information about test modes and information about test patterns.

A test mode may refer to an operation mode in which voltage conditions and time conditions of test signals applied to a memory device are set in advance. The voltage conditions may include voltage levels, slopes, offsets, and waveforms of the test signals. The time conditions may include timings and time periods in which the test signals are applied.

For example, in a test mode, voltages of the test signals may include V1 to Vn, where n is a natural number of 1 or more. Timings at which the test signals are applied or time periods in which the test signals are applied may include T1 to Tm, where m is a natural number of 1 or more.

According to an embodiment, the test signals may include VCORE, VPERI, VPP, VBB, VBBW, VBLP, VCP, VDDI/VSSI, VDDL/VSSDDL, VDDA/VSSA, VREF, and the like. VCORE may refer to a reference voltage for determining a data level of a memory cell. VPERI may refer to a peripheral circuit power voltage of the memory device. VPP may refer to a voltage for reading and writing data through a memory cell transistor. VBB may refer to a bulk voltage of a memory cell transistor, which may have a negative value. VBBW may refer to a power voltage of a negative word line. VBLP may refer to a bit line precharge power voltage. VCP may refer to a power voltage of a cell plate. VDDI/VSSI may refer to an input buffer power voltage. VDDL/VSSDL may refer to a power voltage used in a delay fixed loop. VDDA/VSSA may refer to a power voltage used in a sense amplifier of a memory cell array. VREF may refer to an output voltage of a reference voltage generator. The types of the test signals that may be used are not limited to these examples.

The plurality of test patterns may include program patterns, which are generated by an algorithm for detecting a defect of the memory device. According to an embodiment, the plurality of test patterns may include test patterns according to March, Jump(X/Y), Dist, SI, Jump(Half), Jump (Random), and Block schemes.

In FIG. 3, the plurality of test modes may include first to third test modes TM1 to TM3. In the first to third test modes TM1 to TM3, different voltage conditions and time conditions may be set respectively. The plurality of test patterns may include first and second test patterns TP1 and TP2. The first and second test patterns TP1 and TP2 may have different program patterns, which are set according to an algorithm. However, the number of test modes and the number of test patterns are not limited to this embodiment.

FIG. 4 is a diagram illustrating test result information according to an embodiment of the present disclosure.

In FIG. 4, a test result information may include test results using each test pattern in each of a plurality of test modes. A test result may include an address of a memory device in which fail bits occur, the number of fail bits, and the time taken until the fail bits are detected.

For example, the first test pattern TP1 may be selected as a target pattern. In a default mode DM, in which voltage and time conditions of test signals are set to default values, a test may be performed on the memory device using the first test pattern TP1. As a result of the test, a fail bit may be detected at a first address ADDR1, there may be one (1) fail bit, and a value of the time taken until the fail bit is detected may be two (2). A unit of the time value may vary depending on the performance of the memory device and test environment.

In the test of the memory device performed using the first test pattern TP1 in the first test mode TM1, fail bits may be detected at the first address ADDR1, the number of fail bits may be two (2), and a value of the time taken until the fail bits are detected may be two (2). In the test of the memory device performed using the first test pattern TP1 in the second test mode TM2, fail bits may be detected at the first address ADDR1, the number of fail bits may be three (3), and a value of the time taken until the fail bits are detected may be two (2). In the test of the memory device performed using the first test pattern TP1 in the third test mode TM3, fail bits may be detected at the first address ADDR1, the number of fail bits may be two (2), and a value of the time taken until the fail bits are detected may be two (2).

The second test pattern TP2 may be selected as a target pattern. As a result of testing the memory device using the second test pattern TP2 in the default mode DM, fail bits may be detected at a second address ADDR2, the number of fail bits may be two (2), and a value of the time taken until the fail bits are detected may be two (2).

In the test of the memory device performed using the second test pattern TP2 in the first test mode TM1, fail bits may be detected at the second address ADDR2, the number of fail bits may be two (2), and a value of the time taken until the fail bits are detected may be two (2). In the test of the memory device performed using the second test pattern TP2 in the second test mode TM2, fail bits may be detected at the second address ADDR2, the number of fail bits may be two (2), and a value of the time taken until the fail bits are detected may be two (2). In the test of the memory device performed using the second test pattern TP2 in the third test mode TM3, fail bits may be detected at the second address ADDR2, the number of fail bits may be two (2), and a value of the time taken until the fail bits are detected may be one (1).

The test of the memory device may be performed using each test pattern according to each test mode. Depending on test modes or test patterns, fail bits of the memory device may be detected at different addresses.

Figure 5:
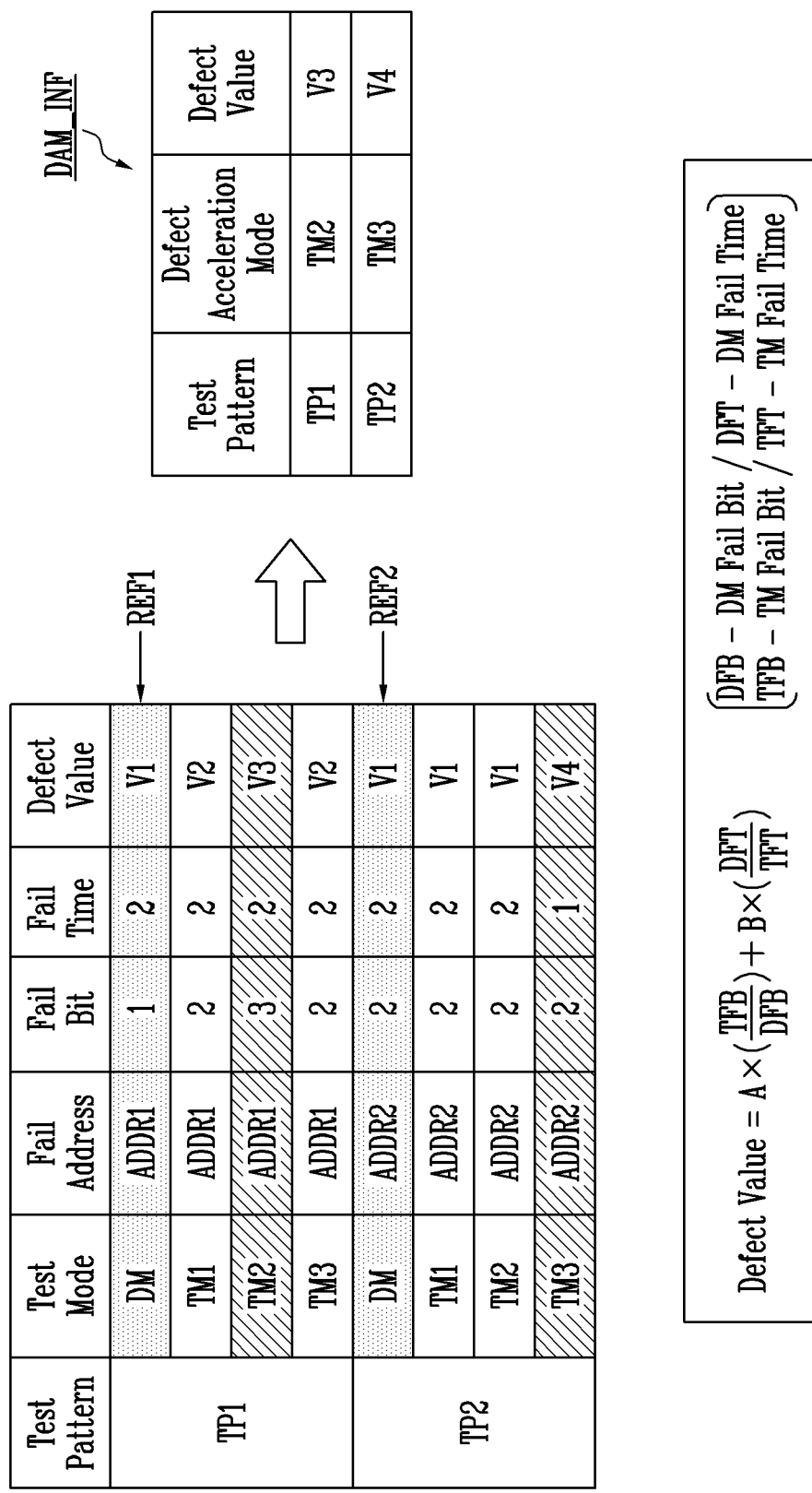
FIG. 5 is a diagram illustrating defect acceleration mode information according to an embodiment of the present disclosure.

FIG. 5 is a diagram illustrating defect acceleration mode information according to an embodiment of the present disclosure.

Referring to FIG. 5, the defect acceleration mode information DAM_INF may include a defect acceleration mode corresponding to each test pattern and a defect value corresponding to the defect acceleration mode. The defect acceleration mode may refer to a mode, from among the plurality of test modes, in which defect detection of the memory device using a target pattern is accelerated the most.

The machine learning processor 230 as described above with reference to FIG. 2 may calculate defect values corresponding to test modes, respectively, using a fail bit count and time taken to detect fail bits as included in test result information for each test pattern.

In FIG. 5, DFB may be a fail bit count corresponding to a default mode and DFT may be a fail bit detection time corresponding to the default mode.

An equation for calculating a defect value may consist of a combination of a term which is in proportion to a fail bit count TFB corresponding to the test mode and a term which is in inverse proportion to a fail bit detection time TFT corresponding to the test mode. In the equation, A and B may represent weights corresponding to the respective terms. A and B each may have a value corresponding to one of a negative number, zero, and a positive number, except the case in which both A and B are zeros. In FIG. 5, it may be assumed that A and B are positive numbers.

An equation for calculating a defect value may consist of various mathematical expressions, including polynomials, with variables of a fail bit count and time taken to detect fail bits. However, the present disclosure is not limited thereto. A default defect value corresponding to each test pattern may serve as criteria for determining whether a defect value corresponding to each test pattern is low or high.

According to the equation for calculating the defect value as shown in FIG. 5, when the first test pattern TP1 is a target pattern, the default defect value corresponding to the default mode DM may be V1(=A+B). The defect value corresponding to the first test mode TM1 may be V2(=2A+B). The defect value corresponding to the second test mode TM2 may be V3(=3A+B). The defect value corresponding to the third test mode TM3 may be V2(=2A+B).

In terms of the first test pattern TP1, the defect value may be the highest in the second test mode TM2. In other words, in the second test mode TM2, defect detection of the memory device using the first test pattern TP1 may be accelerated the most when each of the plurality of test modes is compared to the default mode.

In the same manner, when the second test pattern TP2 is the target pattern, the default defect value corresponding to the default mode DM may be V1(=A+B). The defect value corresponding to the first test mode TM1 may be V1(=A+B). The defect value corresponding to the second test mode TM2 may be V1(=A+B). The defect value corresponding to the third test mode TM3 may be V4(=A+2B).

In terms of the second test pattern TP2, the defect value may be the highest in the third test mode TM3 on the basis of the default mode. In other words, in the third test mode TM3, defect detection of the memory device using the second test pattern TP2 may be the most accelerated compared to other test modes in the plurality of test modes.

In FIG. 5, the defect acceleration mode information DAM_INF may include the second test mode TM2, which is the defect acceleration mode corresponding to the first test pattern TP1 and the defect value V3 calculated in the second test mode TM2. The defect acceleration mode information DAM_INF may include the third test mode TM3, which is the defect acceleration mode corresponding to the second test pattern TP2 and the defect value V4 calculated in the third test mode TM3.

Figure 6:
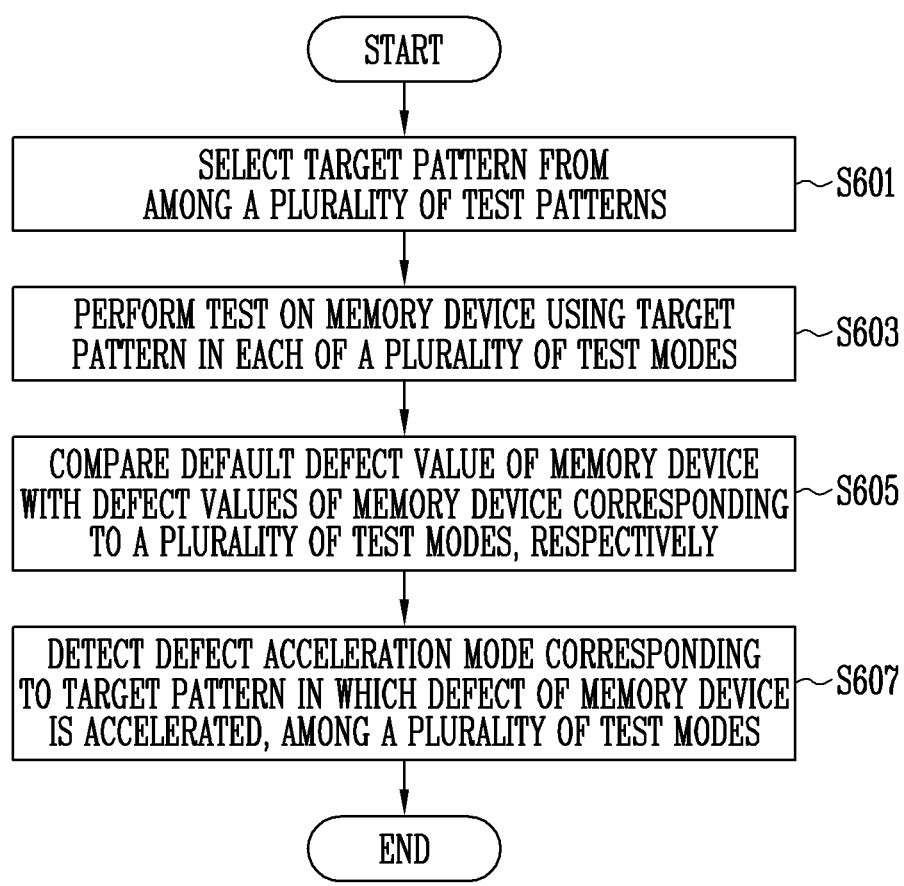
FIG. 6 is a flowchart illustrating operations of a memory controller according to an embodiment of the present disclosure.

FIG. 6 is a flowchart illustrating operations of a memory controller according to an embodiment of the present disclosure.

Referring to FIG. 6, at step S601, a memory controller may select a target pattern from among a plurality of test patterns.

At step S603, the memory controller may perform tests on a memory device in each of a plurality of test modes while using a target pattern.

At step S605, the memory controller may compare a default defect value of the memory device with defect values of the memory device corresponding to each of the plurality of test modes, respectively.

At step S607, the memory controller may detect a defect acceleration mode, from among the plurality of test modes, corresponding to the target pattern based on a comparison result. In the defect acceleration mode, a defect of the memory device may be accelerated.

Figure 7:
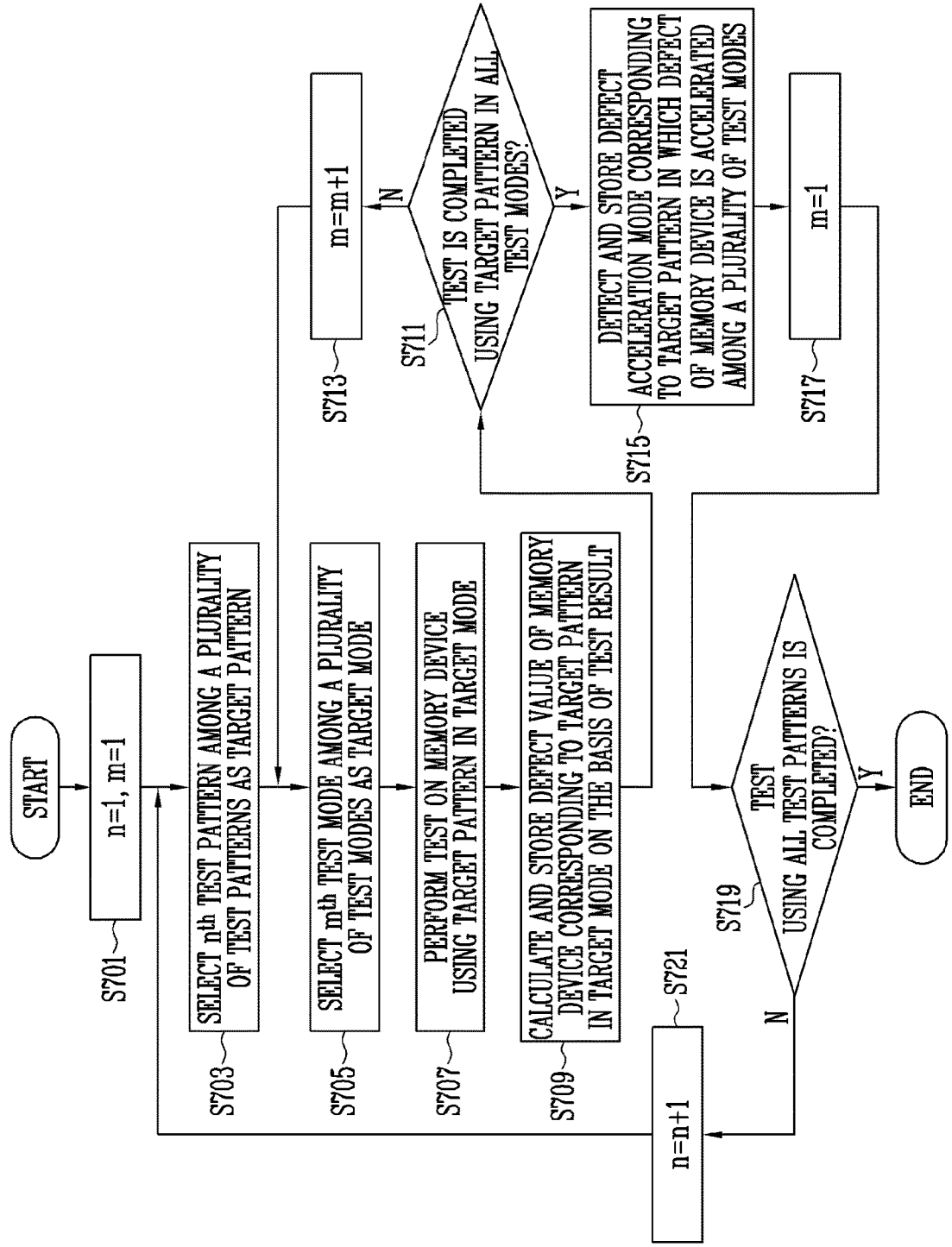
FIG. 7 is a flowchart illustrating operations of a memory controller according to an embodiment of the present disclosure.

FIG. 7 is a flowchart illustrating operations of a memory controller according to an embodiment of the present disclosure.

Referring to FIG. 7, at step S701, a memory controller may set n=1 and m=1.

At step S703, the memory controller may select an nth test pattern, from among a plurality of test patterns, as a target pattern.

At step S705, the memory controller may select an mth test mode, from among a plurality of test modes, as a target mode.

At step S707, the memory controller may perform a test on the memory device using the target pattern in the target mode.

At step S709, the memory controller may calculate and store a defect value of the memory device corresponding to the target pattern in the target mode using a test result.

At step S711, the memory controller may determine whether the test using the target pattern is completed in all test modes. As a result of this determination, if the test using the target pattern is completed in every mode, then the process flow proceeds to step S715. If there exists any test mode in which the test is not performed using the target pattern, the process flow proceeds to step S713.

At step S713, the memory controller may increase the value 'm' by one (1).

At step S715, the memory controller may detect and store a defect acceleration mode, from among the plurality of test modes, corresponding to the target pattern. In the defect acceleration mode, the defect of the memory device may be accelerated.

At step S717, the memory controller may reset the value 'm' to one (1).

At step S719, the memory controller may determine whether the test using all target patterns is completed. As a result of the determination, when the test is completed using all test patterns, the operations may be terminated. When there exists any test pattern for which the test is not completed, the process flow proceeds to step S721.

At step S721, the memory controller may increase the value 'n' by one (1).

According to the embodiment as described above with reference to FIG. 7, the memory device may be tested using each of the plurality of test patterns in each of the test modes, and through this full-scale investigation, a defect acceleration mode optimized for each test pattern may be detected at high reliability.

Figure 8:
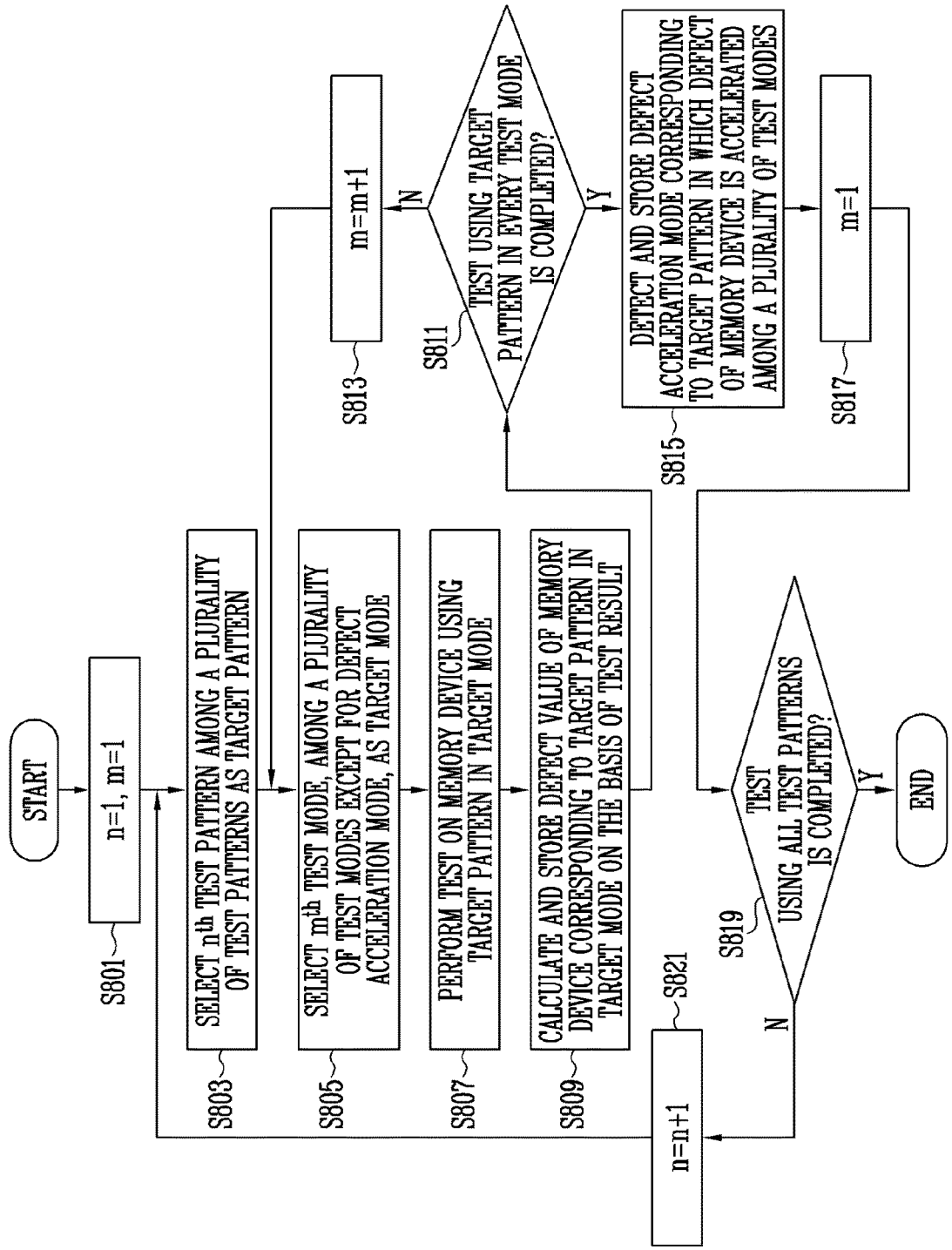
FIG. 8 is a flowchart illustrating operations of a memory controller according to an embodiment of the present disclosure.

FIG. 8 is a flowchart illustrating operations of a memory controller according to an embodiment of the present disclosure.

Referring to FIG. 8, at step S801, a memory controller may set n=1 and m=1.

At step S803, the memory controller may select an nth test pattern, from among a plurality of test patterns, as a target pattern.

At step S805, the memory controller may select an mth test mode among a plurality of test modes, except for a defect acceleration mode corresponding to a previously selected test pattern, as a target mode.

At step S807, the memory controller may perform a test on a memory device using the target pattern in the target mode.

At step S809, the memory controller may calculate and store a defect value of the memory device corresponding to the target pattern in the target mode on the basis of a test result.

At step S811, the memory controller may determine whether the test using the target pattern is completed in every test mode. As a result of the determination, if the test is completed using the target pattern in every mode, then the process flow proceeds to step S815. If there exists any test mode for which the test has not been performed using the target pattern, the process flow proceeds to step S813.

At step S813, the memory controller may increase the value 'm' by one (1).

At step S815, the memory controller may detect and store a defect acceleration mode corresponding to the target pattern. In the defect acceleration mode, the defect of the memory device may be accelerated.

At step S817, the memory controller may reset the value 'm' to one (1).

At step S819, the memory controller may determine whether the test is completed using all target patterns. As a result of the determination, when the test is completed using all test patterns, the operations may be terminated. If there exists any test pattern for which the test is not completed, then the process flow proceeds to step S821.

At step S821, the memory controller may increase the value 'n' by one (1).

According to the embodiment as described with reference to FIG. 8, the memory device may be tested using test patterns in all test modes, except for the defect acceleration mode corresponding to the previous test pattern, which may lead to a decrease in the total number of tests, so that the entire time to detect a defect acceleration mode corresponding to each test pattern may be shortened.

Figure 9:
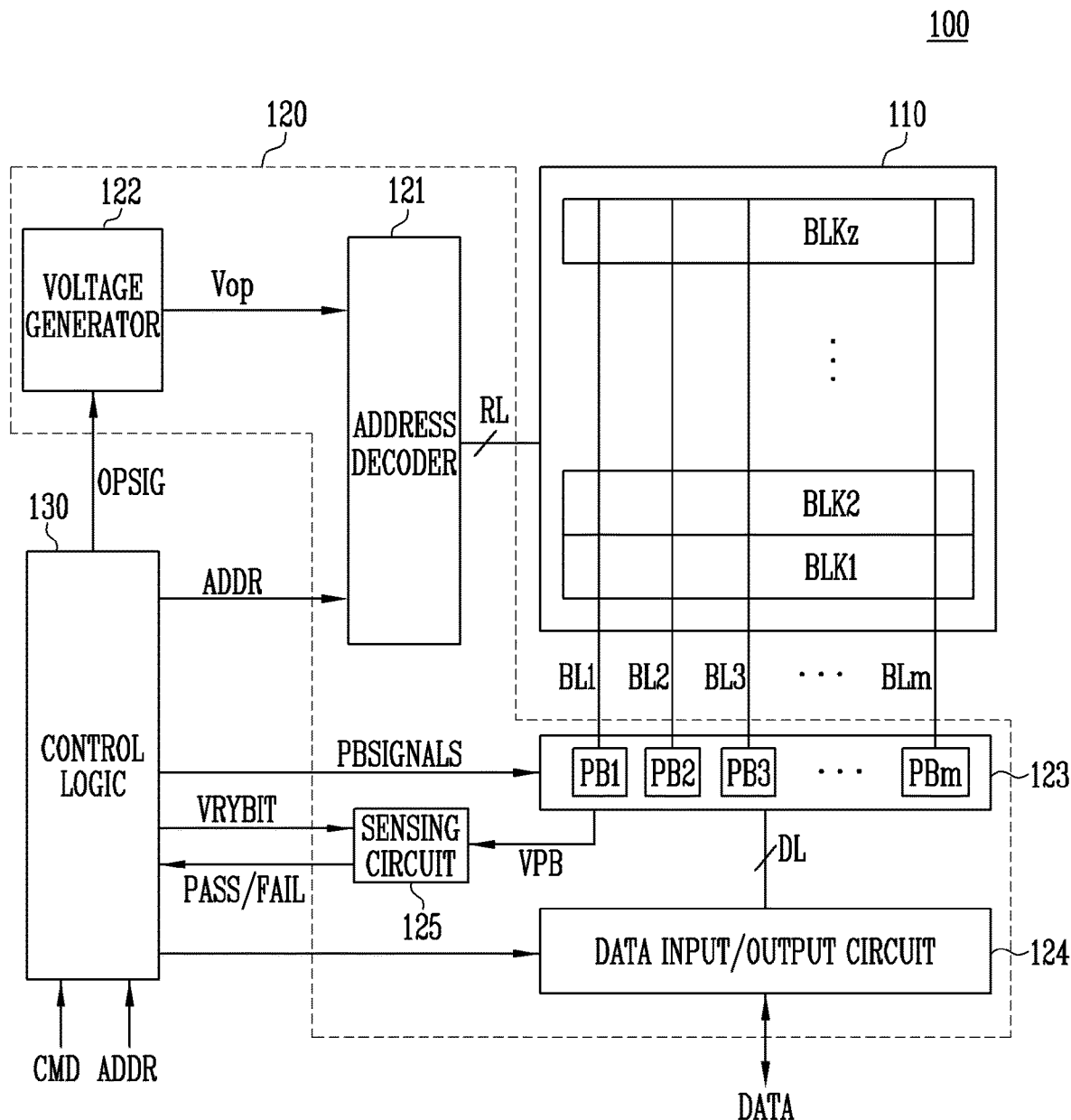
FIG. 9 is a diagram illustrating a memory device of FIG. 1 according to an embodiment of the present disclosure.

FIG. 9 is a diagram illustrating a memory device of FIG. 1 according to an embodiment of the present disclosure.

Referring to FIG. 9, a memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through first to mth bit lines BL1 to BLm. Each of the plurality of memory blocks BLK1 to BLKz may include a plurality of memory cells.

According to an embodiment, the plurality of memory cells may be nonvolatile memory cells. Memory cells coupled to the same word line may be defined as one page. In other words, the memory cell array 110 may include a plurality of pages. According to an embodiment, each of the plurality of memory blocks BLK1 to BLKz included in the memory cell array 110 may include a plurality of dummy cells. One or more dummy cells may be coupled in series between a drain select transistor and memory cells and between a source select transistor and memory cells.

Each of the plurality memory cells included in the memory device 100 may be a single level cell (SLC) that stores one bit of data, a multi-level cell (MLC) that stores two bits of data, a triple level cell (TLC) that stores three bits of data, or a quadruple level cell (QLC) that stores four bits of data.

According to another embodiment, the plurality of memory cells may be volatile memory cells. Each of the volatile memory cells may include a transistor and a capacitor. Examples of types of the volatile memory cells may include a Static Random Access Memory (SRAM) and a Dynamic Random Access Memory (DRAM). The plurality of memory cell arrays 110 may constitute one bank.

The peripheral circuit 120 may include an address decoder 121, a voltage generator 122, a read and write circuit 123, a data input/output circuit 124, and a sensing circuit 125.

The address decoder 121 may be coupled to the memory cell array 110 through the row lines RL. For example, the row lines RL may include drain select lines, word lines, source select lines, and a common source line. According to an embodiment, the word lines may include normal word lines and dummy word lines. According to an embodiment, the row lines RL may further include a pipe select line.

The address decoder 121 may operate in response to control of the control logic 130. The address decoder 121 may receive an address ADDR from the control logic 130.

The address decoder 121 may be configured to decode a block address in the received address ADDR. The address decoder 121 may select at least one memory block from among the memory blocks BLK1 to BLKz according to the decoded block address. The address decoder 121 may select at least one word line of the selected memory block according to the decoded address. The address decoder 121 may apply operating voltages Vop generated by the voltage generator 122 to at least one word line During a program operation, the address decoder 121 may apply a program voltage to the selected word line and a program pass voltage having a lower voltage level than the program voltage to unselected word lines. During a program verify operation, the address decoder 121 may apply a verify voltage to the selected word line and a verify pass voltage greater than the verify voltage to the unselected word lines.

During a read operation, the address decoder 121 may apply a read voltage to the selected word line and a read pass voltage greater than the read voltage to the unselected word lines.

According to an embodiment, an erase operation of the memory device 100 may be performed in units of memory blocks. During an erase operation, the address decoder 121 may select one of the memory blocks according to the decoded address. During the erase operation, the address decoder 121 may apply a ground voltage to word lines coupled to the selected memory block.

The address decoder 121 may be configured to decode a column address of the received address ADDR. The address decoder 121 may transfer the decoded column address to the read and write circuit 130. For example, the address decoder 121 may include components such as a row decoder, a column decoder, and an address buffer.

The voltage generator 122 may be configured to generate a plurality of voltages by using an external power voltage supplied to the memory device 100. The voltage generator 122 may be controlled by the control logic 130.

According to an embodiment, the voltage generator 122 may generate an internal power voltage by regulating an external power voltage. The internal power voltage generated by the voltage generator 122 may serve as an operating voltage of the memory device 100.

According to an embodiment, the voltage generator 122 may generate a plurality of operating voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage so as to generate the plurality of operating voltages Vop having various voltage levels. The voltage generator 122 may generate the plurality of operating voltages Vop by selectively activating the plurality of pumping capacitors in response to the control of the control logic 130.

The plurality of generated operating voltages Vop may be supplied to the memory cell array 110 by the address decoder 121.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to the control of the control logic 130.

The first to mth page buffers PB1 to PBm may communicate data DATA with the data input/output circuit 124. During program, the first to mth page buffers PB1 to PBm may receive the data DATA to be stored through the data input/output circuit 124 and data lines DL.

During a program operation, the first to mth page buffers PB1 to PBm may transfer the data DATA received through the data input/output circuit 124 to selected memory cells through the first to mth bit lines BL1 to BLm when a program voltage is applied to a selected word line. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (e.g., a power voltage) is applied may be maintained. During a program verify operation, the first to mth page buffers PB1 to PBm may read the data DATA stored in the memory cells through the first to mth bit lines BL1 to BLm from the selected memory cells.

During a read operation, the read and write circuit 123 may read the data DATA from the memory cells of the selected page through bit lines BL and store the read data DATA in the first to mth page buffers PB1 to PBm.

During an erase operation, the read and write circuit 123 may float the bit lines BL. According to an embodiment, the read and write circuit 123 may include a column select decoder.

A page buffer circuit may include a plurality of page buffers. In FIG. 9, the plurality of page buffers may be the first to mth page buffers PB1 to PBm.

The data input/output circuit 124 may be coupled to the first to mth page buffers PB1 to PBm through the plurality of data lines DL. The data input/output circuit 124 may be controlled by the control logic 130.

The data input/output circuit 124 may include a plurality of input/output buffers (not shown) that receive the data DATA being input. During a program operation, the data input/output circuit 124 may receive the data DATA to be stored from an external controller (not shown). During a read operation, the data input/output circuit 124 may output the data DATA transferred from the first to mth page buffers PB1 to PBm included in the read and write circuit 123 to the external controller.

According to an embodiment, the data input/output circuit 124 may include a data pad that outputs the data received from the read and write circuit 123 to the external controller.

During a read operation or a verify operation, the sensing circuit 125 may generate a reference current in response to an allowable bit VRYBIT that is generated by the control logic 130 and may output a pass signal or a fail signal to the control logic 130 by comparing a sensing voltage VPB received from the read and write circuit 123 with a reference voltage generated by the reference current.

According to an embodiment, the sensing circuit 125 may include a fail bit counter that counts fail bits included in sensing data received from the read and write circuit 123.

The control logic 130 may be coupled to the address decoder 121, the voltage generator 122, the read and write circuit 123, the data input/output circuit 124, and the sensing circuit 125. The control logic 130 may be configured to control the general operations of the memory device 100. The control logic 130 may operate in response to a command CMD transferred from an external device.

The control logic 130 may control the peripheral circuit 120 by generating various signals in response to the command CMD and the address ADDR. For example, the control logic 130 may output an operation signal OPSIG, the address ADDR, a read and write control signal PBSIGNALS, and an allowable bit VRYBIT in response to the command CMD and the address ADDR. The control logic 130 may output the operation signal OPSIG to the voltage generator 122, output the address ADDR to the address decoder 121, output the read and write control signal PBSIGNALS to the read and write circuit 123, and output the allowable bit VRYBIT to the sensing circuit 125. In addition, the control logic 130 may determine whether a verify operation passes or fails in response to a pass or fail signal PASS/FAIL output by the sensing circuit 125.

Figure 10:
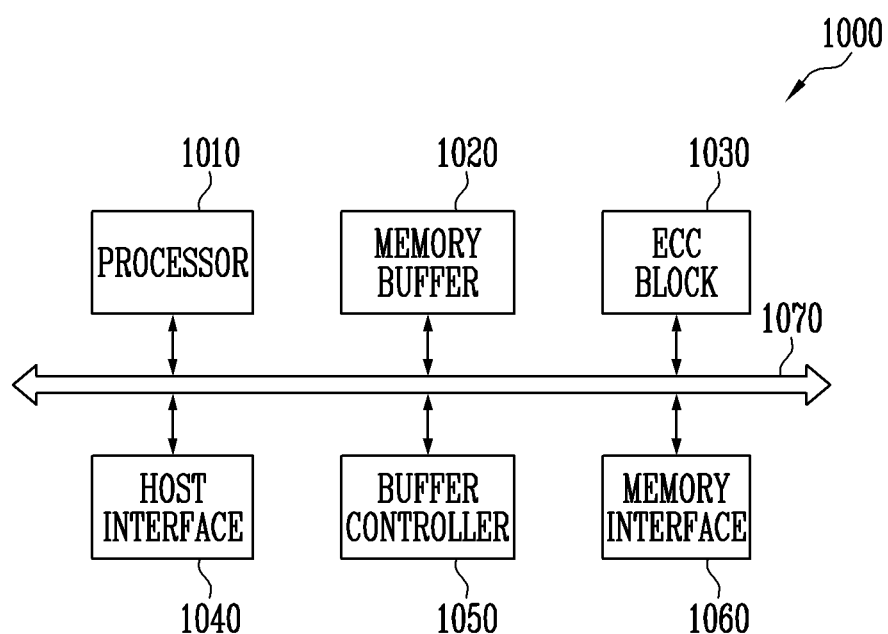
FIG. 10 is a diagram illustrating another embodiment of a memory controller as shown in FIG. 1.

FIG. 10 is a diagram illustrating another embodiment of a memory controller 200 as shown in FIG. 1.

Referring to FIG. 10, a memory controller 1000 may be coupled to a host and a memory device. In response to a request from the host, the memory controller 1000 may access the memory device. For example, the memory controller 1000 may control write, read, erase, and background operations of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) block 1030, a host interface 1040, a buffer controller 1050, a memory interface 1060, and a bus 1070.

The bus 1070 may provide a channel between components of the memory controller 1000.

The processor 1010 may control the overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer controller 1050. The processor 1010 may control operations of the storage device by using the memory buffer 1020 as a working memory, a cache memory or a buffer memory.

The processor 1010 may translate a logical block address (LBA), provided by the host, into a physical block address (PBA). A flash translation layer FTL may receive the logical block address (LBA) and translate the logical block address (LBA) into the physical block address (PBA) by using a mapping table. There may be various address mapping methods for the flash translation layer FTL, depending on a mapping unit. Typical address mapping methods may include a page mapping method, a block mapping method and a hybrid mapping method.

When the memory device corresponds to a non-volatile memory, the processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may use a derandomizing seed to derandomize data received from the memory device. The derandomized data may be output to the host.

According to an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may communicate with the external host using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer controller 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 may not include the memory buffer 1020 and the buffer controller 1050.

For example, the processor 1010 may control the operations of the memory controller 1000 using codes. The processor 1010 may load codes from a nonvolatile memory device (e.g., Read Only Memory (ROM)) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other and may neither interfere with nor influence each other. The data bus may be coupled to the host interface 1040, the buffer controller 1050, the ECC block 1030, and the memory interface 1060. The control bus may be coupled to the host interface 1040, the processor 1010, the buffer controller 1050, the memory buffer 1020, and the memory interface 1060.

Figure 11:
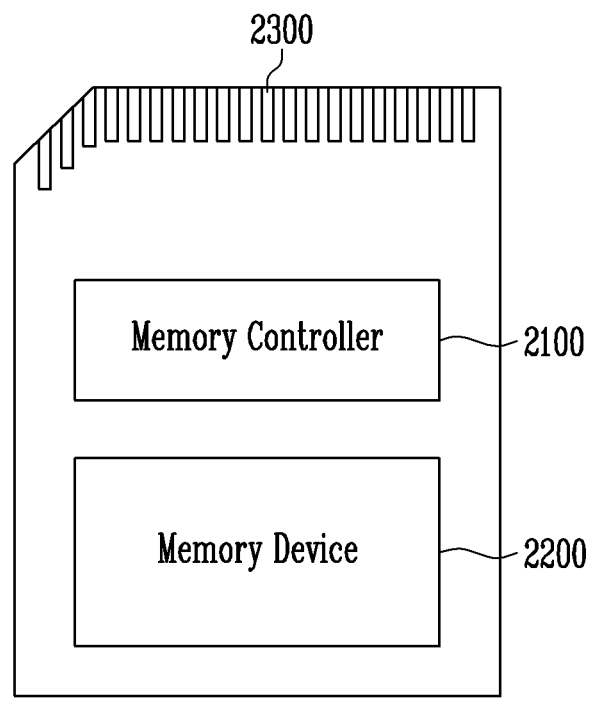
FIG. 11 is a block diagram illustrating a memory card system to which a storage device according to an embodiment of the disclosure is applied.

FIG. 11 is a block diagram illustrating a memory card system to which a storage device according to an embodiment of the disclosure is applied.

Referring to FIG. 11, the memory card system 2000 may include a memory controller 2100, a memory device 2200 and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory device 2200 may be realized in the same manner as the memory controller 200 as described above with reference to FIG. 1.

In an embodiment, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a specific communication protocol.

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, MMCmicro, or eMMC), an SD card (SD, miniSD, microSD, or SDHC), a universal flash storage (UFS), and the like.

The present disclosure provides a memory controller having optimal defect detection performance and a method of operating the memory controller.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described exemplary embodiments of the present disclosure without departing from the spirit or scope of the invention. Thus, it is intended that the present disclosure cover all such modifications provided they come within the scope of the appended claims and their equivalents.

What is claimed is:

1. A memory controller, comprising:
a test controller configured to perform a test on a memory device using a target pattern selected from among a plurality of test patterns for each of a plurality of test modes, in which test signals have voltage and time conditions that are set differently;
a test information storage configured to store test result information including values associated with fail bits of the memory device measured in the test; and
a machine learning processor configured to detect a defect acceleration mode, from among the plurality of test modes, in which a defect of the memory device is accelerated using the test result information obtained in the test performed using the target pattern.

2. The memory controller of claim 1, wherein the test information storage stores test setup information about the plurality of test patterns and the plurality of test modes and defect acceleration mode information about the defect acceleration mode.

3. The memory controller of claim 1, wherein the test controller performs the test on the memory device using the target pattern in a default mode in which the voltage and time conditions of the test signals are set to default values, and
wherein the test information storage stores the test result information including the default values associated with the fail bits of the memory device.

4. The memory controller of claim 3, wherein the machine learning processor calculates a default defect value using the default values, calculates defect values corresponding to the plurality of test modes, respectively, using the respective values associated with the fail bits corresponding to the plurality of test modes, and detects the defect acceleration mode using a comparison result between the default defect value and the defect values corresponding to the plurality of test modes, respectively.

5. The memory controller of claim 4, wherein the defect values are determined using a number of fail bits of the memory device detected in the test and the time to detect the fail bits.

6. The memory controller of claim 5, wherein the defect values are proportional to the number of fail bits and inversely proportional to the time to detect the fail bits.

7. The memory controller of claim 1, wherein the voltage conditions of the test signals include voltage levels, slopes, offsets, and waveforms of the test signals.

8. The memory controller of claim 1, wherein the time conditions of the test signals include timings at which the test signals are applied and periods in which the test signals are applied.

9. The memory controller of claim 1, wherein the plurality of test patterns include program patterns generated according to an algorithm for detecting a defect of the memory device.

10. The memory controller of claim 1, wherein the test controller performs a test on the memory device using a second target pattern, from among the plurality of test patterns, that is different from the target pattern in the plurality of test modes, except for the defect acceleration mode corresponding to the target pattern.

11. A method of operating a memory controller, the method comprising:
performing a test on a memory device using a target pattern selected from among a plurality of test patterns in each of a plurality of test modes in which voltage and time conditions of test signals are set differently;
calculating a defect value on the basis of values associated with fail bits of the memory device measured in the test; and
detecting a defect acceleration mode, from among the plurality of test modes, in which a defect of the memory device is accelerated in the test performed using the target pattern based on test result information including the defect value.

12. The method of claim 11, further comprising:
performing the test on the memory device using the target pattern in a default mode in which the voltage and time conditions of the test signals are set to default values; and
calculating a default defect value of the memory device measured in the test performed using the target pattern in the default mode.

13. The method of claim 12, wherein the detecting of the defect acceleration mode comprises detecting the defect acceleration mode on the basis of a comparison result between the default defect value and the defect value corresponding to each of the plurality of test modes.

14. The method of claim 11, wherein the calculating of the defect value comprises calculating the defect value on the basis of a number of fail bits of the memory device detected in the test and time to detect the fail bits.

15. The method of claim 14, wherein the defect value is proportional to the number of fail bits and inversely proportional to the time to detect the fail bits.

16. The method of claim 11, wherein the voltage conditions of the test signals include levels, slopes, and waveforms of voltages applied to the test signals.

17. The method of claim 11, wherein the time conditions of the test signals include timings at which the test signals are applied and periods in which the test signals are applied.

18. The method of claim 11, further comprising performing a test on the memory device using a second target pattern, selected from among the plurality of test patterns and different from the target pattern, in each of the plurality of test modes.

19. The method of claim 11, further comprising performing a test on the memory device using a second target pattern, selected from among the plurality of test patterns and different from the target pattern, in the plurality of test modes except for the defect acceleration mode corresponding to the target pattern.

* * * * *